United States Patent
Sakui et al.

(10) Patent No.: US 9,767,904 B2
(45) Date of Patent: Sep. 19, 2017

(54) MEMORY WITH THREE TRANSISTOR MEMORY CELL DEVICE

(71) Applicant: MICRON TECHNOLOGY, INC., Boise, ID (US)

(72) Inventors: Koji Sakui, Tokyo (JP); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 14/455,449

(22) Filed: Aug. 8, 2014

(65) Prior Publication Data

US 2014/0347932 A1    Nov. 27, 2014

Related U.S. Application Data

(62) Division of application No. 13/217,867, filed on Aug. 25, 2011, now Pat. No. 8,804,424.

(51) Int. Cl.
*G11C 16/10* (2006.01)
*G11C 16/04* (2006.01)
*G11C 16/26* (2006.01)

(52) U.S. Cl.
CPC ...... *G11C 16/0408* (2013.01); *G11C 16/0433* (2013.01); *G11C 16/0483* (2013.01); *G11C 16/10* (2013.01); *G11C 16/26* (2013.01)

(58) Field of Classification Search
CPC . G11C 16/0408; G11C 16/10; G11C 16/0433; G11C 16/0483; G11C 16/26
See application file for complete search history.

(56) References Cited

U.S. PATENT DOCUMENTS

| | | | |
|---|---|---|---|
| 5,754,469 A * | 5/1998 | Hung | G11C 11/5621 365/185.03 |
| 6,304,486 B1 * | 10/2001 | Yano | G11C 16/3436 365/185.12 |
| 6,307,807 B1 | 10/2001 | Sakui et al. | |
| 6,370,081 B1 | 4/2002 | Sakui et al. | |
| 6,512,703 B2 | 1/2003 | Sakui et al. | |
| 6,657,892 B2 | 12/2003 | Sakui et al. | |
| 6,801,458 B2 | 10/2004 | Sakui et al. | |
| 7,031,195 B2 | 4/2006 | Sato et al. | |
| 7,099,200 B2 | 8/2006 | Sakui | |
| 7,173,850 B2 | 2/2007 | Sakui et al. | |
| 7,301,809 B2 | 11/2007 | Sakui et al. | |
| 7,332,766 B2 | 2/2008 | Hasegawa et al. | |
| 7,333,369 B2 | 2/2008 | Sakui et al. | |
| 7,388,783 B2 | 6/2008 | Sakui | |
| 7,463,540 B2 | 12/2008 | Sakui et al. | |
| 7,791,952 B2 | 9/2010 | Roohparvar | |
| 7,898,859 B2 | 3/2011 | Ghodsi | |

(Continued)

FOREIGN PATENT DOCUMENTS

WO    WO 2011/005665 A1    1/2011

*Primary Examiner* — Douglas King
(74) *Attorney, Agent, or Firm* — Dicke, Billig & Czaja, PLLC

(57) ABSTRACT

Memory, memory devices, and a method for a backup sequence are disclosed. In one such memory device, sense circuitry and page buffers are coupled between a three transistor memory cell device and a non-volatile memory device. Enable/disable gates enable selective access to the sense circuitry and page buffers by either the three transistor memory cell device or the non-volatile memory device.

17 Claims, 6 Drawing Sheets

(56) References Cited

U.S. PATENT DOCUMENTS

| | | |
|---|---|---|
| 2003/0048661 A1 | 3/2003 | Sakui et al. |
| 2004/0032788 A1 | 2/2004 | Sakui et al. |
| 2004/0188710 A1* | 9/2004 | Koren ................. G11C 16/102 257/197 |
| 2004/0240273 A1 | 12/2004 | Sakui |
| 2005/0041476 A1 | 2/2005 | Sakui et al. |
| 2005/0094431 A1 | 5/2005 | Sato et al. |
| 2005/0218460 A1 | 10/2005 | Hasegawa et al. |
| 2006/0239073 A1* | 10/2006 | Toda ................... G11C 11/5642 365/185.03 |
| 2006/0245263 A1 | 11/2006 | Sakui |
| 2007/0127292 A1 | 6/2007 | Sakui et al. |
| 2007/0133282 A1 | 6/2007 | Sakui et al. |
| 2007/0133283 A1 | 6/2007 | Sakui et al. |
| 2008/0212373 A1 | 9/2008 | Hasegawa et al. |
| 2009/0106481 A1 | 4/2009 | Yang et al. |
| 2009/0193058 A1* | 7/2009 | Reid ................... G06F 11/1068 |
| 2010/0329011 A1 | 12/2010 | Lee et al. |
| 2011/0072200 A1 | 3/2011 | Lee et al. |

* cited by examiner

MEMORY WITH THREE TRANSISTOR MEMORY CELL DEVICE

RELATED APPLICATION

This application is a divisional of U.S. patent application Ser. No. 13/217,867, titled "MEMORY WITH THREE TRANSISTOR MEMORY CELL DEVICE," filed Aug. 25, 2011 and issued as U.S. Pat. No. 8,804,424 on Aug. 12, 2014, which is commonly assigned and incorporated in its entirety herein by reference.

TECHNICAL FIELD

The present invention relates generally to memory and in a particular embodiment the present invention relates to three transistor memory cell devices.

BACKGROUND

Non-volatile memory has evolved from the Electrically Erasable Programmable Read-Only Memory (EEPROM). An EEPROM is a type of non-volatile ROM that can be erased by exposing it to an electrical charge. The EEPROM provides programming on a per-byte basis. However, the density of the EEPROM is limited by its larger cell size. Flash memory was designed to have both a smaller cell size and a faster programming rate than EEPROM.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory comprises a memory array organized in columns and rows. Changes in threshold voltage of the memory cells, through programming of charge storage structures (e.g., floating gates or charge traps) or other physical phenomena (e.g., phase change or polarization), determine the data value of each cell. The cells are usually grouped into blocks. Each of the cells within a block can be electrically programmed, such as by charging the charge storage structure. The data in a cell of this type is determined by the presence or absence of the charge in the charge storage structure. The charge can be removed from the charge storage structure by an erase operation.

Flash memory having a NOR architecture provides a smaller cell size and, thus, the possibility of greater memory density as compared to the EEPROM. A NOR architecture flash memory comprises a memory cell having a drain contact coupled to a data line (e.g., bit line) and a source contact coupled to a source line. The trade-off to obtaining the smaller memory cell size with the NOR architecture flash memory was that NOR architecture memory was no longer programmable on a byte basis. Erase of NOR architecture flash memory is on a block basis. Programming of NOR architecture is on a word, byte, or bit basis. NOR architecture also uses a logical—to—physical address table and wear leveling algorithm during programming.

A NAND architecture flash memory is organized as series strings of memory cells. Each series string of memory cells comprises a number of flash memory cells coupled serially drain-to-source between a select gate drain (SGD) transistor and a select gate source (SGS) transistor. One end of the series string is coupled to its respective bit line and the other end is coupled to a source line. The NAND architecture provides higher memory cell density than EEPROM as well as faster programming. However, the NAND architecture eliminated random reading of memory cells. Each read is performed on page basis.

For the reasons stated above, and for other reasons stated below that will become apparent to those skilled in the art upon reading and understanding the present specification, there is a need in the art for memory having the benefits of both EEPROM and flash memory.

DETAILED DESCRIPTION

Figure 1:
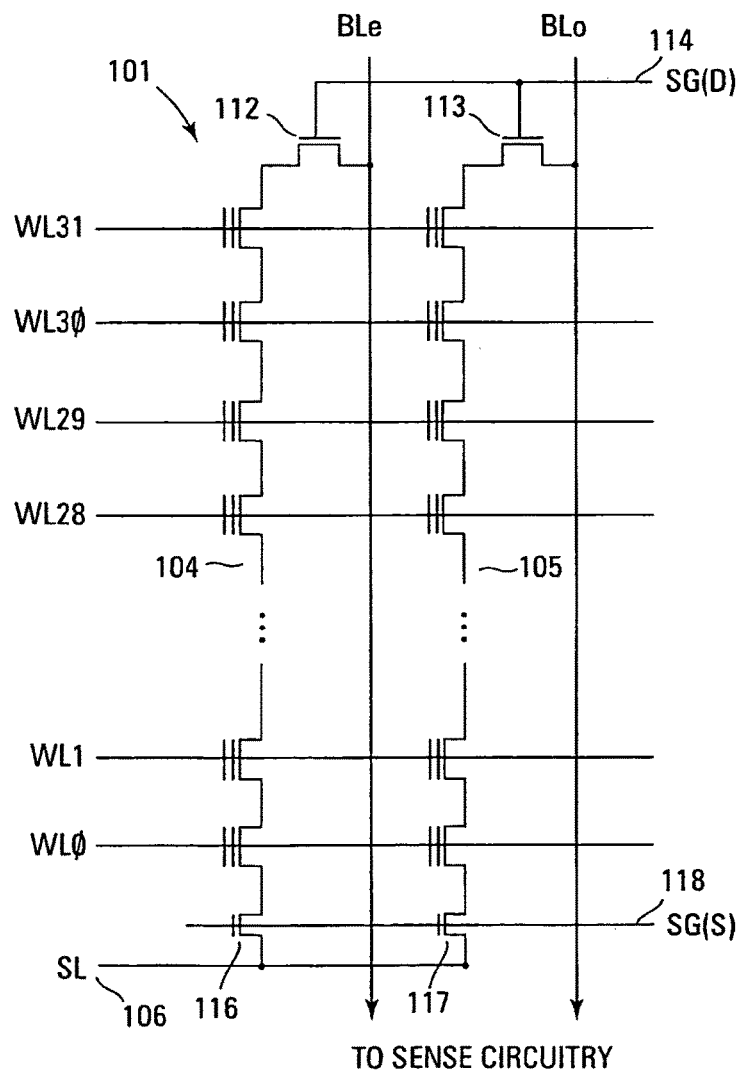
FIG. 1 shows a schematic diagram of one embodiment of a portion of a NAND architecture memory array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a schematic diagram of a portion of a NAND architecture memory array 101 comprising series strings of non-volatile memory cells. While the subsequent discussion refers to a NAND memory device, the present embodiments are not limited to such an architecture but can be used in other memory device architectures as well.

The array comprises an array of non-volatile memory cells 101 (e.g., floating gate or charge trap transistors) arranged in columns such as series strings 104, 105. Each of the cells 101 is coupled drain to source in each series string 104, 105. An access line (e.g. word line) WL0-WL31 that spans across multiple series strings 104, 105 is connected to the control gates of each memory cell in a row in order to bias the control gates of the memory cells in the row. Data lines, such as even and odd bit lines BLe, BLo are coupled to the strings of memory cells and eventually connected to sense circuitry (e.g., sense amplifiers) (not shown) that detect the state of each cell by sensing current or voltage on a particular bit line.

Each series string 104, 105 of memory cells is coupled to a source line 106 by a source select gate 116, 117 and to an individual bit line BLe, BLo by a drain select gate 112, 113. The source select gates 116, 117 are controlled by a source select gate control line SG(S) 118 coupled to their control gates. The drain select gates 112, 113 are controlled by a drain select gate control line SG(D) 114.

Each memory cell can be programmed as single level cell (SLC) memory or multilevel cell (MLC) memory. Each cell's threshold voltage is indicative of the data that are stored in the cell. For example, in an SLC, a $V_t$ of 0.5V might indicate a programmed cell while a $V_t$ of −0.5V might indicate an erased cell. The MLC uses multiple $V_t$ ranges that each indicate a different state. Multilevel cells can take advantage of the analog nature of a traditional flash cell by assigning a bit pattern to a specific voltage range that can be stored on the cell. This technology permits the storage of more than one bit per cell (e.g., two bits per cell or more), depending on the quantity of voltage ranges assigned to the cell.

Figures 2, 3:
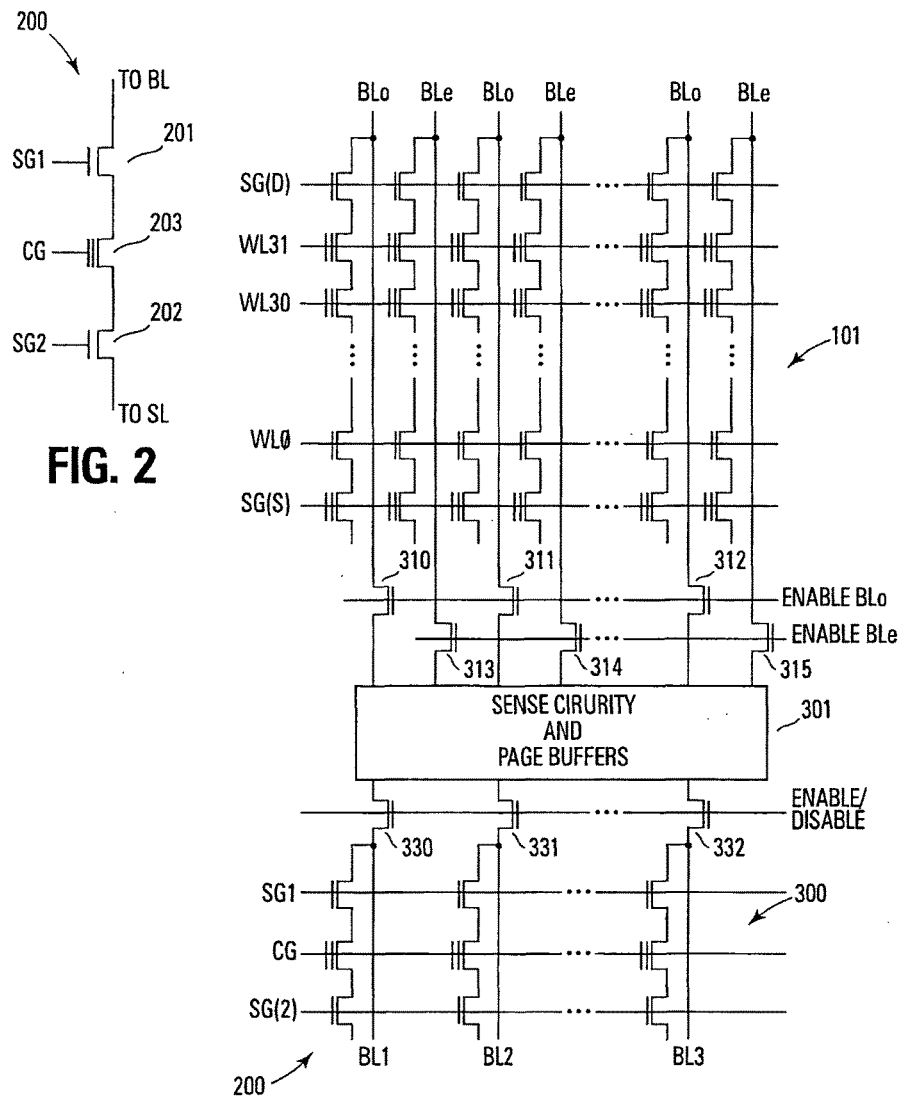
FIG. 2 shows a schematic diagram of one embodiment of a three transistor memory device.
FIG. 3 shows a schematic diagram of one embodiment of a memory device in accordance with the embodiments of FIGS. 1 and 2.

FIG. 2 illustrates a three transistor memory cell device 200. The three transistor memory cell device 200 comprises a memory cell 203 and two select gates 201, 202 (e.g., select transistors).

The memory cell 203 of the three transistor memory cell device 200 can comprise the same type of memory cell (e.g., floating gate or charge trap transistor) as is used in the array of FIG. 1. The drain of the memory cell 203 is coupled to a first select gate 201 and the source of the memory cell 203 is coupled to a second select gate 202. The drain of the first select gate 201 is then coupled to a bit line BL (not shown) and the source of the second select gate 202 is coupled to a source line SL (not shown). Operation (e.g., programming, erasing, reading) of the three transistor memory cell device 200 is substantially similar to the operation of the non-volatile memory cell series strings of FIG. 1.

For example, to program the memory cell 203, the control gate CG is biased with a programming voltage ($V_{pgm}$) while the bit line BL is biased with an enable voltage (e.g., 0V). SG1 is biased with a voltage (e.g., $V_{CC}$) to activate the first select gate 201 while SG2 is biased with a voltage (e.g., 0V) to deactivate the second select gate 202. After a threshold voltage of the memory cell 203 reaches a target threshold voltage, the bit line BL can be biased with an inhibit voltage (e.g., $V_{CC}$).

An example of an erase operation includes biasing the control gate CG of the memory cell 203 at a reference potential (e.g., 0V) or allowing it to float. The semiconductor tub that comprises the memory cell 203 is then biased with a large positive voltage (e.g., 18-20V). Both select gates 201, 202 can be deactivated by biasing the SG1 and SG2 lines at 0V.

An example of a read operation includes biasing the control gate CG of the memory cell 203 at a read voltage ($V_{READ}$) that is of a sufficient voltage to turn on the memory cell 203. The first select gate 201 is activated to couple the drain connection of the memory cell 203 to a bit line. The second select gate 202 is activated to couple the source connection of the memory cell 203 to the source line. A sense circuit that is coupled to the bit line can then determine a threshold voltage on the memory cell 203 in response to a voltage or current detected on the bit line.

FIG. 3 illustrates a schematic diagram of one embodiment of a memory device that incorporates both a non-volatile memory array 101, such as illustrated in FIG. 1, and an array of three transistor memory cell devices 300, such as illustrated in FIG. 2. Sense circuitry and page buffers 301 are located between the non-volatile memory array 101 and the array of three transistor memory cell devices 300.

As described previously, the sense circuitry determines whether a memory cell has reached a target threshold voltage by detecting either current or voltage on the bit line coupled to the sense circuitry. The page buffers can be used for temporary storage of data that is being loaded into either the memory cells of the non-volatile memory array or the three transistor memory cell devices.

The array of three transistor memory cell devices 300 comprises at least one three transistor memory cell device 200. Each three transistor memory cell device is coupled to a different bit line BL1, BL2, BL3. An enable/disable gate (e.g., transistor) 330-332 couples a respective bit line BL1, BL2, BL3 to the sense circuitry and page buffers 301. An enable/disable signal is coupled to a control gate of each of the enable/disable gates 330-332. In one embodiment, the array of three transistor memory cell devices 300 is a page of memory.

In one embodiment, when the enable/disable signal is 0V, all of the bit lines BL1, BL2, BL3 are disconnected from the sense circuitry and page buffers 301. When the enable/disable signal is a voltage such that the enable/disable gates 330-332 are activated, all of the bit lines BL1, BL2, BL3 are coupled to the sense circuitry and page buffers 301 simultaneously.

Similarly, the bit lines BLo, BLe of the non-volatile memory array 101 are also each coupled to the sense circuitry and page buffers 301 through a different enable/disable gate 310-315 (e.g., transistor). Control gates for each of the odd bit line enable/disable gates 310-312 are coupled to an odd bit line enable signal ENABLE BLo. Control gates for each of the even bit line enable/disable gates 313-315 are coupled to an even bit line enable signal ENABLE BLe.

Thus, in one embodiment, when the ENABLE BLo signal is a voltage that is greater than 0V and the ENABLE BLe signal is 0V, the enable/disable gates 310-312 for the odd bit lines are activated to couple the odd bit lines to the sense circuitry and page buffers 301 while simultaneously disconnecting the even bit lines from the sense circuitry and page buffers 301. Also in one embodiment, when the ENABLE BLe signal is a voltage that is greater than 0V and the ENABLE BLo signal is 0V, the enable/disable gates 313-315 for the even bit lines are activated to couple the even bit lines to the sense circuitry and page buffers 301 while simultaneously disconnecting the odd bit lines from the sense circuitry and page buffers 301.

It can be seen from the above operation description that when the series strings of memory cells coupled to the even bit lines are to be read by the sense circuitry 301, the even bit line enable/disable gates 313-315 are enabled and the odd bit line enable/disable gates 310-312 are disabled. When the series strings of memory cells coupled to the odd bit lines are to be read by the sense circuitry 301, the odd bit line enable/disable gates 310-312 are enabled and the even bit line enable/disable gates 313-315 are disabled. When the array of three transistor memory cell devices 300 are to be read by the sense circuitry 301, the enable/disable gates 330-332 are enabled and both the odd and even enable/disable gates 310-315 are disabled.

Locating the sense circuitry and page buffers 301 between the non-volatile memory array 101 and the array of three transistor memory cell devices 300 can provide numerous benefits. For example, the bit line length for a bit line coupled to the three transistor memory cell device 200 can be shorter than that of the non-volatile memory array 101. This can result in a reduced bit line capacitance as well as bit line resistance for the three transistor memory cell device 200.

As described previously, in order to attain a smaller cell size when migrating from byte EEPROM to NOR Flash memory to NAND Flash memory, byte programming was eliminated while Logical-to-Physical address (LP) tables and wear leveling were implemented. Therefore, the hybrid three transistor memory cell devices implement the byte programming while keeping the smaller NAND memory cell size. Since the array of three transistor memory cell devices can act as a cache for the non-volatile memory array, per byte basis programming is available because the erase block size is the same as the page size and the page buffers can be utilized for the byte programming.

Figure 4:
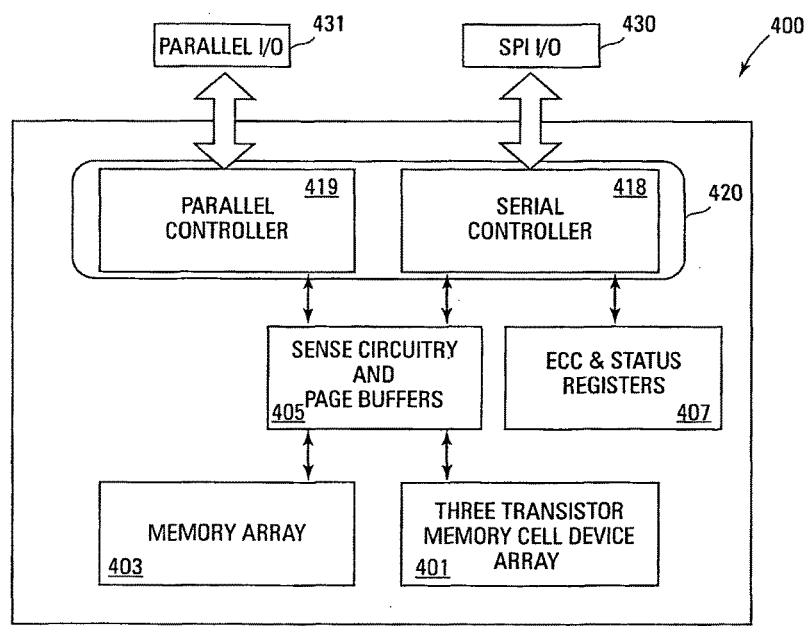
FIG. 4 shows a block diagram of one embodiment of a memory device with both a parallel interface and a serial peripheral interface in accordance with the embodiment of FIG. 3.

FIG. 4 illustrates a block diagram of one embodiment of a memory device 400 that incorporates the embodiment of FIG. 3 as well as a serial peripheral interface (SPI) input/output (I/O) 430. The memory device 400 additionally has parallel I/O 431. Each of these I/O 430, 431 can be coupled to an external device (e.g., processor, controller) (not shown) for controlling and/or communicating with the memory device 400.

The SPI I/O 430 provides a serial means for communicating with an external device. The external device can thus communicate with the memory device 400 exclusively over either the parallel I/O 431 or the SPI I/O 430. In another embodiment, the external device can communicate over both the parallel I/O 431 and the SPI I/O 430.

The memory device 400 additionally comprises a memory array 403. In one embodiment, the memory array 403 comprises a NAND architecture with MLC memory cells. The memory device 400 also comprises a three transistor memory cell device array 401. In one embodiment, the memory array 403 is a 64 Gb memory array and the three transistor memory cell device array 401 is a 128 Mb array.

Sense circuitry and page buffers 405 are coupled between the two memory arrays 401, 403. As previously described with reference to FIG. 3, the sense circuitry and page buffers 405 are commonly used by both memory arrays 401, 403 and their individual access to the sense circuitry and page buffers 405 is controlled by enable/disable gates.

Parallel 419 and serial 418 controllers control operation of the memory device 400. While shown as separate controller blocks 418, 419, in one embodiment the parallel and serial controllers 418, 419 can be one controller block 420 that shares common circuitry between the two controller functions 418, 419. For example, the common controller circuitry 420 can use separate software routines for the individual parallel and serial controller functions 418, 419.

The controller circuitry 420 is coupled to the sense circuitry and page buffers 405. In one embodiment, the controller circuitry 420 is responsible for controlling access to the common sense circuitry and page buffers by the memory array 403 and the three transistor memory cell device array 401.

Error correction code (ECC) and status registers 407 are also coupled to the controller circuitry 420. The controller circuitry 420 can use these registers during operation to store ECC data and memory status data.

Figure 5B:
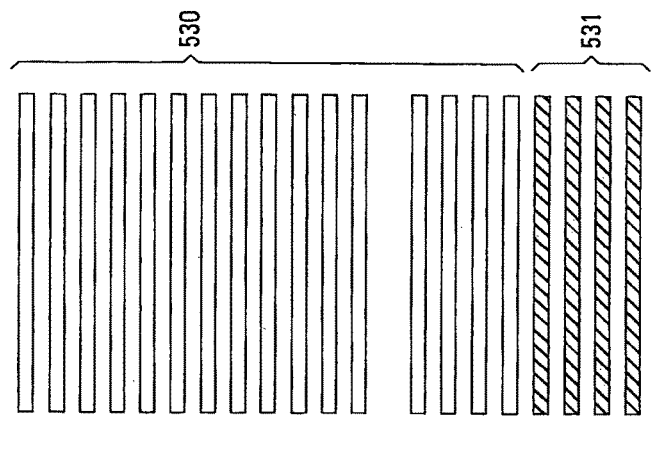
FIGS. 5A and 5B show diagrams of two embodiments of memory incorporating backup pages.
Figure 5A:
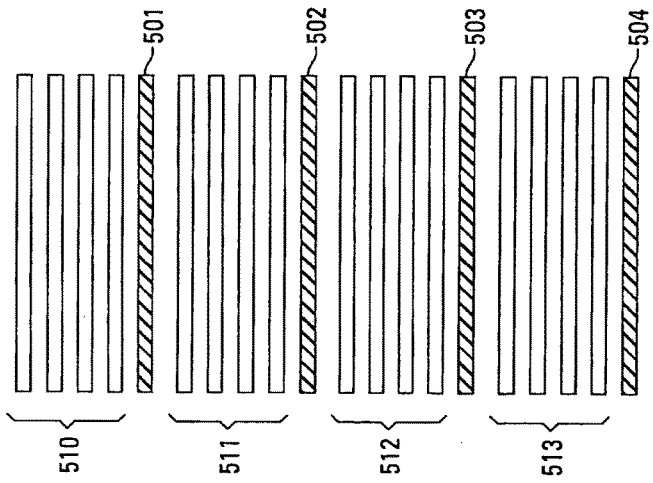

FIGS. 5A and 5B each illustrate a different embodiment of a non-volatile memory device incorporating backup pages that can be used to backup data during memory transfer operations. Thus, if power is lost or data is corrupted during the transfer of data (e.g., wear leveling) between memory pages, the backup pages will have the original data for restoring to a particular data page. In one embodiment, the backup pages comprise three transistor memory cell devices.

FIG. 5A illustrates an embodiment where each backup page 501-504 is located after a predetermined quantity of data pages 510-513. In one embodiment, a backup page 501-504 is located after every four data pages 510-513. In such an embodiment, the backup page 501 can share common sense circuitry and page buffers with one of the adjacent groups of data pages 510 or 511.

The data pages are SLC memory. In one embodiment, there are 512 data pages and 128 backup pages. Alternate embodiments can use other page quantities and sizes for both the data page and the backup page.

FIG. 5B illustrates another embodiment of the non-volatile device with backup pages. This embodiment locates the backup pages 531 in one grouping while the data pages 530 are grouped separately.

Figure 6:
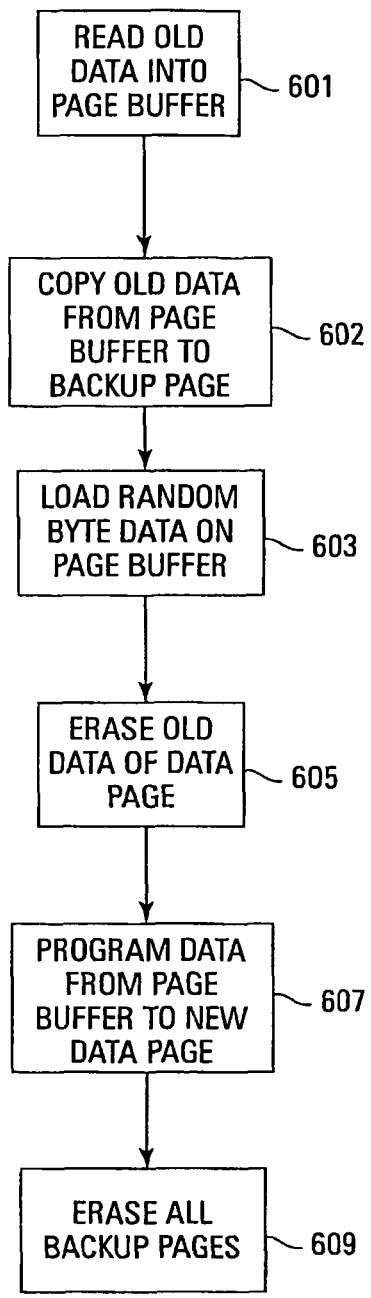
FIG. 6 shows a flowchart of one embodiment of a method for performing a backup sequence using backup pages.

FIG. 6 illustrates a flowchart of one embodiment of a method for performing a backup sequence using backup pages. In one embodiment, this method can use three transistor memory cell devices as the backup pages.

The old data is first read into a page buffer 601. The old data is then copied from the page buffer to a backup page 602. Random data is then loaded into the page buffers 603 that are coupled to the backup page. The old data that is still in the data page is erased 605. At this point, the old data is now in the backup page and erased from the original data page.

The data from the page buffer can then be programmed to a new data page 607. All backup pages can now be erased 609 to be ready for future transfers.

Figure 7:
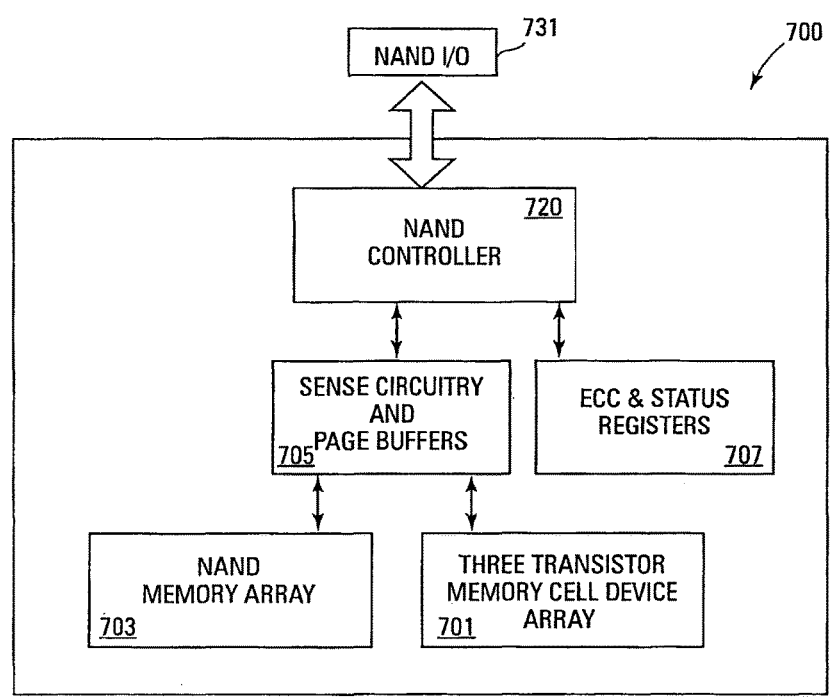
FIG. 7 shows a block diagram of one embodiment of a single NAND memory device in accordance with the embodiment of FIG. 3.

FIG. 7 illustrates a block diagram of one embodiment of a memory device 700 that incorporates the embodiment of FIG. 3. The memory device 400 additionally has NAND I/O 731 that can be coupled to an external device (e.g., processor, controller) (not shown) for controlling and/or communicating with the memory device 700.

The memory device 700 comprises a memory array 703. In one embodiment, the memory array 703 comprises a NAND architecture with MLC memory cells. The memory device 700 also comprises a three transistor memory cell device array 701. In one embodiment, the memory array 703 is a 64 Gb memory array and the three transistor memory cell device array 701 is a 128 Mb array.

Sense circuitry and page buffers 705 are coupled between the two memory arrays 701, 703. As previously described with reference to FIG. 3, the sense circuitry and page buffers 705 are commonly used by both memory arrays 701, 703 and their individual access to the sense circuitry and page buffers 705 is controlled by enable/disable gates.

A NAND controller 720 provides a controlling function for the memory device 700. The controller 720 can control the memory operations (e.g., programming, erasing, reading) as well as other functions of the memory 700.

The controller 720 is coupled to the sense circuitry and page buffers 705. In one embodiment, the controller 720 is responsible for controlling access to the common sense circuitry and page buffers by the memory array 703 and the three transistor memory cell device array 701.

Error correction code (ECC) and status registers 707 are also coupled to the controller 720. The controller 720 can use these registers during operation to store ECC data and memory status data.

CONCLUSION

One or more embodiments can use three transistor memory cell devices that can provide faster access, as well as random access, without using a logical to physical table. Sense circuitry and page buffers are located between, and shared with, a NAND memory array. The three transistor memory cell devices can be used in backup pages of memory so that random data on a per byte basis can be loaded into the page buffers to be programmed into the three transistor memory cell devices without the logical to physical table.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A memory device comprising:
    a controller;
    a plurality of non-volatile memory cells comprising a plurality of non-volatile data memory cells coupled to a plurality of non-volatile backup memory cells through sense circuitry and page buffers, wherein the sense circuitry and the page buffers are located between and coupled between the plurality of non-volatile data memory cells and the plurality of non-volatile backup memory cells;
    wherein the controller is configured to cause first data to be read from a first page of the plurality of non-volatile data memory cells to the page buffers;
    wherein the controller is configured to cause the first data to be copied from the page buffers to the plurality of non-volatile backup memory cells;
    wherein the controller is configured to cause random data to be loaded to the page buffers on a per byte basis to produce second data in the page buffers while the first data is in the plurality of non-volatile backup memory cells;
    wherein the controller is configured to erase the first data from the first page of the plurality of non-volatile data memory cells while the first data is in the plurality of non-volatile backup memory cells;
    wherein the controller is configured to cause the second data in the page buffers to be programmed to a second page of the plurality of non-volatile data memory cells while the first data is in the plurality of non-volatile backup memory cells; and
    wherein the controller is configured to cause the first data to be erased from the plurality of non-volatile backup memory cells in response to the second data being caused to be programmed to the second page of the plurality of non-volatile data memory cells.

2. The memory device of claim 1 wherein the plurality of non-volatile backup memory cells comprise a page of non-volatile backup memory cells.

3. The memory device of claim 1 wherein the plurality of non-volatile backup memory cells are non-volatile three transistor memory cell devices.

4. The memory device of claim 3 wherein each of the non-volatile three transistor memory cell devices comprises a non-volatile backup memory cell between two select transistors.

5. The memory device of claim 3 wherein each of the non-volatile three transistor memory cell devices is coupled to a respective data line that is coupled to the sense circuitry by an enable/disable transistor.

6. The memory device of claim 1 wherein the plurality of non-volatile backup memory cells comprise a plurality of pages of non-volatile backup memory cells, each page of non-volatile backup memory cells located after a particular quantity pages of non-volatile data memory cells.

7. The memory device of claim 6 wherein each page of non-volatile backup memory cells comprises non-volatile three transistor memory cell devices that share sense circuitry with an adjacent page of non-volatile data memory cells.

8. The memory device of claim 6 wherein all of the plurality of pages of non-volatile backup memory cells are located together as one group with only one page of non-volatile backup memory cells having an adjacent page of non-volatile data memory cells.

9. The memory device of claim 1 wherein the non-volatile data memory cells are prevented from being read by the sense circuitry while the non-volatile backup memory cells are being read by the sense circuitry.

10. The memory device of claim 1 further comprising:
    a plurality of first enable/disable transistors that are configured to couple the plurality of non-volatile data memory cells to the sense circuitry; and
    a plurality of second enable/disable transistors that are configured to couple the plurality of non-volatile backup memory cell to the sense circuitry.

11. The memory device of claim 10, wherein the plurality of first enable/disable transistors are configured so that all of the plurality of first enable/disable transistors are disabled when the plurality of second enable/disable transistors are enabled.

12. The memory device of claim 1 wherein the plurality of non-volatile data memory cells comprises a plurality of strings of non-volatile data memory cells, wherein the strings of non-volatile data memory cells of the plurality of strings of non-volatile data memory cells are respectively coupled to respective ones of a plurality of data lines, wherein respective ones of a plurality of enable/disable transistors are configured to respectively couple the respective ones of the plurality of data lines to the sense circuitry.

13. A memory device comprising:
    a controller;
    a plurality of non-volatile memory cells comprising a plurality of non-volatile data memory cells coupled to a plurality of non-volatile backup memory cells through sense circuitry and page buffers, wherein the sense circuitry and the page buffers are located between and coupled between the plurality of non-volatile data memory cells and the plurality of non-volatile backup memory cells;
    wherein the controller is configured to cause first data to be read from a first page of the plurality of non-volatile data memory cells to the page buffers;
    wherein the controller is configured to cause random data to be loaded to the page buffers on a per byte basis to produce second data in the page buffers;
    wherein the controller is configured to cause the second data in the page buffers to be written to a second page of the plurality of non-volatile data memory cells;
    wherein the plurality of non-volatile data memory cells comprises a plurality of strings of non-volatile data memory cells, wherein respective ones of a plurality of first select transistors are respectively located between and connected to respective ones of the plurality of strings of non-volatile data memory cells and respective ones of a plurality of first data lines, wherein respective ones of a plurality of first enable/disable transistors are respectively connected to the respective ones of the plurality of first data lines and the sense circuitry, wherein the respective ones of the plurality of first select transistors are configured to respectively couple the respective ones of the plurality of strings of non-volatile data memory cells to the respective ones of the plurality of first data lines, and wherein the respective ones of the plurality of first enable/disable transistors are configured to respectively couple the respective ones of the plurality of first data lines to the sense circuitry;

wherein the plurality of backup memory cells comprises a plurality of non-volatile three transistor memory cell devices, wherein respective ones of second select transistors respectively of respective ones of the plurality of non-volatile three transistor memory cell devices are respectively connected to respective ones of a plurality of second data lines, wherein respective ones of a plurality of second enable/disable transistors are respectively connected to the respective ones of the plurality of second data lines and to the sense circuitry, wherein the respective ones of the plurality of second select transistors are configured to respectively couple the respective ones of the plurality of non-volatile three transistor memory cell devices to the respective ones of the plurality of second data lines, and wherein the respective ones of the plurality of second enable/disable transistors are configured to respectively couple the respective ones of the plurality of second data lines to the sense circuitry; and wherein the plurality of first enable/disable transistors are configured so that all of the plurality of first enable/disable transistors are disabled when the plurality of second enable/disable transistors are enabled.

14. The memory device of claim 13 wherein the respective ones of the plurality of the first enable/disable transistors are respectively located between and are respectively connected to the respective ones of the plurality of first select transistors and the sense circuitry.

15. The memory device of claim 13 wherein the respective ones of the plurality of the second enable/disable transistors are respectively located between and are respectively connected to the respective ones of the plurality of second select transistors and the sense circuitry.

16. The memory device of claim 13, wherein the controller is configured to cause the first data to be copied from the page buffers to the plurality of non-volatile backup memory cells.

17. The memory device of claim 16, wherein the controller is configured to cause the first data to be erased from the plurality of non-volatile backup memory cells after the second data in the page buffers is programmed to the second page of the plurality of non-volatile data memory cells.

\* \* \* \* \*